US010569297B2

(12) United States Patent
Harumoto et al.

(10) Patent No.: US 10,569,297 B2
(45) Date of Patent: Feb. 25, 2020

(54) COATING METHOD (71) Applicant: SCREEN Holdings Co., Ltd., Kyoto (JP)

(72) Inventors: Masahiko Harumoto, Kyoto (JP); Yuji Tanaka, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 150 days.

(21) Appl. No.: 15/556,174

(22) PCT Filed: Feb. 12, 2016

(86) PCT No.: PCT/JP2016/054173
§ 371 (c)(1),
(2) Date: Sep. 6, 2017

(87) PCT Pub. No.: WO2016/152308
PCT Pub. Date: Sep. 29, 2016

(65) Prior Publication Data
US 2018/0036767 A1 Feb. 8, 2018

(30) Foreign Application Priority Data

Mar. 25, 2015 (JP) .................................. 2015-062718

(51) Int. Cl.
*B05D 3/12* (2006.01)
*B05D 1/40* (2006.01)
(Continued)

(52) U.S. Cl.
CPC ............... *B05D 1/40* (2013.01); *B05D 1/005* (2013.01); *B05D 3/04* (2013.01); *H01L 21/027* (2013.01);
(Continued)

(58) Field of Classification Search
CPC .. B05D 1/005; B05D 1/40; B05D 3/04; H01L 21/6715; H01L 21/6708; H01L 21/027
(Continued)

(56) References Cited

U.S. PATENT DOCUMENTS 5,939,139 A * 8/1999 Fujimoto ............... B05C 11/08
118/52
6,117,486 A * 9/2000 Yoshihara ............... G03F 7/162
427/240
(Continued)

FOREIGN PATENT DOCUMENTS

JP 62-013029 A 1/1987
JP 64-047474 A 2/1989
(Continued)

OTHER PUBLICATIONS

Office Action dated Oct. 16, 2018 in corresponding Japanese Patent Application No. 2015-062718.
(Continued)

*Primary Examiner* — Kirsten Jolley
(74) *Attorney, Agent, or Firm* — Ostrolenk Faber LLP (57) ABSTRACT

A substrate is rotated with a holding rotator to form a coating liquid film on the substrate, and at least a part of an excess of the coating liquid is pushed out toward a periphery edge of the substrate by a centrifugal force caused by the rotation of the substrate to build up the excess of the coating liquid along the periphery edge of the substrate. Moreover, gas is blown to the periphery edge of the substrate through a gas nozzle to exhaust the excess of the coating liquid building up at the periphery edge. Blowing the gas toward the periphery edge of the substrate through the gas nozzle makes the coating liquid unbalanced that builds up without being exhausted outside the substrate due to its surface tension. Accordingly, the rotation achieves the coating liquid film having a uniform thickness while the coating liquid film is formed to be thick.

12 Claims, 7 Drawing Sheets (51) Int. Cl.
    *H01L 21/67*     (2006.01)
    *B05D 3/04*     (2006.01)
    *H01L 21/027*     (2006.01)
    *B05D 1/00*     (2006.01)

(52) U.S. Cl.
    CPC ...... *H01L 21/6708* (2013.01); *H01L 21/6715* (2013.01)

(58) Field of Classification Search
    USPC .......................................................... 427/240
    See application file for complete search history.

(56) References Cited

U.S. PATENT DOCUMENTS

| | | | | |
|---|---|---|---|---|
| 6,255,228 B1 * | 7/2001 | Rolfson | ............ | H01L 21/67051 |
| | | | | 427/126.1 |
| 2003/0022515 A1 | 1/2003 | Nakagawa | ..................... | 438/734 |
| 2004/0126923 A1 * | 7/2004 | Benson | ..................... | B08B 5/02 |
| | | | | 438/58 |
| 2008/0090186 A1 | 4/2008 | Harumoto et al. | ............ | 430/434 |
| 2013/0089668 A1 | 4/2013 | Inagaki et al. | ................ | 427/261 |

FOREIGN PATENT DOCUMENTS

| | | |
|---|---|---|
| JP | 05-266472 A | 10/1993 |
| JP | 06-283417 A | 10/1994 |
| JP | 09-106980 A | 4/1997 |
| JP | 2001-110712 A | 4/2001 |
| JP | 2003-007612 A | 1/2003 |
| JP | 2003-37053 A | 2/2003 |
| JP | 2003-181361 A | 7/2003 |
| JP | 2007-324153 A | 12/2007 |
| JP | 2010-099589 A | 5/2010 |
| JP | 2010-164871 A | 7/2010 |
| JP | 2011-036847 A | 2/2011 |
| JP | 2012-256780 A | 12/2012 |
| JP | 2013-78748 A | 5/2013 |
| JP | 2013-187497 A | 9/2013 |
| TW | 200825638 | 6/2008 |
| WO | WO 2011/114883 A1 | 9/2011 |

OTHER PUBLICATIONS

International Search Report dated May 10, 2016 in corresponding PCT International Application No. PCT/JP2016/054173.
Written Oliinion dated May 10, 2016 in corresponding PCT International Application No. PCT/JP206/054173.
Notice of Allowance dated Feb. 26, 2019 in corresponding Japanese Patent Application No. 2015-062718.

* cited by examiner

COATING METHOD

RELATED APPLICATIONS

This application is the U.S. National Phase application under 35 U.S.C. § 371, of international Application No. PCT/JP2016/054173, filed on Feb. 12, 2016, which in turn claims the benefit of Japanese Application No. 2015-062718, filed on Mar. 25, 2015, the disclosures of which applications are incorporated by reference herein. The PCT International Application was published in the Japanese language.

TECHNICAL FIELD

The present invention relates to a coating method for applying a coating liquid to substrates such as semiconductor substrates, glass substrates for liquid crystal display, glass substrates for photomask, and optical disk substrates.

BACKGROUND ART

A coating apparatus includes a holding rotator that holds and rotates a substrate, and a coating nozzle that dispenses a coating liquid such as a photoresist (hereinunder, referred to as a "resist") to the substrate held with the holding rotator. The coating apparatus causes the coating nozzle to dispense the coating liquid to the substrate, and causes the holding rotator to rotate the substrate. Rotating the substrate leads to spread of the coating liquid on the substrate, yielding formation of a liquid film (coating liquid film) on the substrate. See, for example, Patent Literatures 1 and 2.

During coating with such a coating apparatus mentioned above, gas is blown. For instance, Patent Literature 1 discloses an edge rinse method of dispensing a solvent to a resist film at a periphery edge of a substrate to dissolve the resist film and scattering the dissolved resist film out of the substrate through an air-blowing device. Patent Literature 2 discloses the feature of performing edge rinse to a periphery edge of a wafer having a thin film formed thereon, and thereafter, blowing an $N_2$ gas to the periphery edge of the wafer for achieving planarization of a raised portion of a periphery edge of the thin film caused by edge rinse.

Moreover, Patent Literature 3 discloses an edge rinse method of blowing gas to an edge of a substrate having an undried coating film formed thereon for promoting a drying treatment. In such a method, gas is blown after formation of the coating film, and a portion of the substrate other than the edge thereof is kept undried even after the gas is blown. Patent Literature 4 discloses a method of supplying a solvent to a substrate, dispensing a coating liquid on a film of the solvent in an inkjet manner, and finally blowing gas on an uneven surface of the coating liquid for yielding planarization of the surface of the coating liquid.

Patent Literature

[Patent Literature 1] Japanese Unexamined Patent Publication No. 2013-187497A
[Patent Literature 2] Japanese Unexamined Patent Publication 09-106980A
[Patent Literature 3] Japanese Unexamined Patent Publication No. 2003-181361A
[Patent Literature 4] Japanese Unexamined Patent Publication No. 2013-078748A

SUMMARY OF INVENTION

Technical Problem

High etching resistance as well as application of a thicker coating liquid film (thick film) such as a resist is needed along with a three-dimensional semiconductor device in recent years.

The thick film is conventionally obtained through increase in viscosity of the coating liquid and fine adjustment of the thick film is performed through variation in rotation speed (revolutions per minute: rpm) of the substrate. High viscosity causes many problems such as a high-power pump, an enlarged diameter of a supply pipe, an enlarged diameter of a drain pipe, cup cleaning, and contamination of minute bubbles within the film. Accordingly, the thick film is desirably obtained by adjustment in rotation speed while the viscosity of the coating liquid is kept low with no increase of the viscosity.

The coating liquid film is formed to be thicker as the rotation speed decreases. The process of adjusting the thickness of the coating liquid film is called main spin from when dispensation of the resist liquid is finished until when drying is finished. As for a 300 mm wafer (substrate), an available range of the rotation speed in the main spin is from 800 to 2000 rpm, for example. If the main speed is lower than this range, a problem may arise that uniformity in thickness of the coating liquid film on the wafer in plane is degraded. In other words, if the main spin is performed within the available range, a coating liquid film having a uniform thickness is formable, but a liquid film having a sufficient thickness is not formable. Then, if the main spin is set at lower rotation speeds out of the available range for obtaining a further thicker liquid film, a centrifugal force acting on the coating liquid of the substrate significantly decreases, leading to difficulty in scattering of the coating liquid from the periphery edge of the substrate. As a result, the substrate is rotated while the coating liquid remains on the periphery edge of the substrate, and thus the substrate is to be dried while the coating liquid remains on the periphery edge of the substrate. Accordingly, the coating liquid film becomes thicker like a mountain at the periphery edge of the substrate, degrading the uniformity in thickness of the coating liquid film.

The present invention has been made regarding the state of the art noted above, and its one object is to provide a coating method that obtains a uniform thickness of a liquid coating film by rotation while the liquid film is formed to be thicker.

Solution to Problem

The present invention is constituted as stated below to achieve the above object. One aspect of the present invention provides a coating method, including a dispensing step of dispensing a coating liquid to a substrate through a coating nozzle; a coating liquid building-up step of rotating the substrate with a holding rotator to form a liquid film of the coating liquid on the substrate and pushing at least a part of an excess of the coating liquid toward a periphery edge of the substrate with a centrifugal force cause by rotation of the substrate to build up the excess of the coating liquid along the periphery edge of the substrate; and a gas blowing step of blowing gas through a gas nozzle to the periphery edge of the substrate before drying of the coating liquid on the substrate by the rotation of the substrate is finished to exhaust the excess of the coating liquid building up at the periphery edge outside the substrate.

With the coating method according to the aspect of the present invention, the substrate is rotated with the holding rotator to form the liquid film of the coating liquid on the substrate, and at least a part of the excess of the coating liquid is pushed out toward the periphery edge of the substrate by a centrifugal force caused by the rotation of the substrate to build up the excess of the coating liquid along the periphery edge of the substrate. Moreover, the gas is blown to the periphery edge of the substrate through the gas nozzle to exhaust the excess of the coating liquid building up at the periphery edge. Blowing the gas toward the periphery edge of the substrate through the gas nozzle makes the coating liquid unbalanced that builds up without being exhausted outside the substrate due to its surface tension. Accordingly, the rotation achieves the liquid film of the coating liquid having a uniform thickness while the liquid film of the coating liquid is formed to be thick.

In the coating liquid building-up step of the coating method, the substrate is rotated for building up the excess of the coating liquid at a rotation speed below 500 rpm. The rotation at the speed below 500 rpm achieves the liquid film of the coating liquid having a uniform thickness while the liquid film of the coating liquid is formed to be thick.

Moreover, in the gas blowing step of the coating method, the gas is blown to the periphery edge of the substrate through the gas nozzle before the drying of the coating liquid on the substrate by the rotation is finished and after dispensation of the coating liquid is finished. If the gas is blown while the coating liquid is dispensed to the substrate, control should be made to both the dispensation of the coating liquid and blowing of the gas. However, since the gas is blown after dispensation of the coating liquid is finished, control may be made to either the dispensation of the coating liquid or the blowing of the gas, leading to simplified control.

Moreover, in the gas blowing step of the coating method, the gas is blown to the periphery edge of the substrate through the gas nozzle before the drying of the coating liquid on the substrate by the rotation is finished and after the substrate is rotated to a rotation speed at which the excess of the coating liquid builds up. Since the gas is blown at a constant stable condition after the substrate is rotated to the rotation speed at which the excess of the coating liquid builds up, control of the gas blowing is simplified.

Moreover, in the gas blowing step of the coating method, the gas is blown through the gas nozzle for a preset period of time. The excess of the coating liquid building up at the periphery edge of the substrate is able to be exhausted outside the substrate in correspondence to the period of time during which the gas is blown.

Moreover, in the gas blowing step of the coating method, the gas is blown through the gas nozzle at preset pressure. The excess of the coating liquid building up at the periphery edge of the substrate is able to be exhausted outside the substrate in correspondence to the pressure at which the gas is blown.

Moreover, in the gas blowing step of the coating method, the gas is blown through the gas nozzle a plurality of times set in advance. For instance, the frequency of blowing the gas is controlled for the preset period of time, leading to control of a quantity of the excess of the coating liquid exhausted outside the substrate. In addition, blowing the gas intermittently allows variation in blowing the gas.

Moreover, in the coating method, the gas nozzle has a circular blowing port. Accordingly, the gas is able to be blown as dots, leading to easy discharge of the excess of the coating liquid out of the substrate.

Moreover, in the gas blowing step of the coating method, the gas is blown through the gas nozzle to the periphery edge of the substrate from an inside portion to an outside portion of the substrate. This allows effective exhaust of the coating liquid building up at the periphery edge of the substrate outside the substrate.

Moreover, the coating method further includes an edge rinse step of performing edge rinse to the coating liquid at the periphery edge of the substrate after the drying of the coating liquid film on the substrate by the rotation is finished. The coating liquid film at the periphery edge of the substrate that becomes thicker readily is removed with the edge rinse, whereby a more planar coating liquid film is formable. In addition, the gas is blown to exhaust the excess of the coating liquid building up at the periphery edge of the substrate, whereby a uniform thick film is formable. This causes a suppressed width of the substrate to which the edge rinse is performed, achieving pattern formation near the periphery edge of the substrate.

Moreover, in the gas blowing step of the coating method, the gas nozzle is fixedly disposed. This allows simplified control of the gas nozzle.

Moreover, in the gas blowing step of the coating method, the gas nozzle is movable in a radius direction of the substrate by a preset width of the periphery edge of the substrate. This allows variation in position of the periphery edge of the substrate where the gas is blown, leading to promoted exhaust of the coating liquid building up at the periphery edge of the substrate.

Advantageous Effects of Invention

With the coating method according to the aspect of the present invention, the substrate is rotated with the holding rotator to form the liquid film of the coating liquid on the substrate, and at least a part of the excess of the coating liquid is pushed out toward the periphery edge of the substrate by a centrifugal force caused by the rotation of the substrate to build up the excess of the coating liquid along the periphery edge of the substrate. Moreover, the gas is blown to the periphery edge of the substrate through the gas nozzle to exhaust the excess of the coating liquid building up at the periphery edge. Blowing the gas toward the periphery edge of the substrate through the gas nozzle makes the coating liquid unbalanced that builds up without being exhausted outside the substrate due to its surface tension. Accordingly, the rotation achieves the liquid film of the coating liquid having a uniform thickness while the liquid film of the coating liquid is formed to be thick.

DESCRIPTION OF EMBODIMENT

Figure 1:
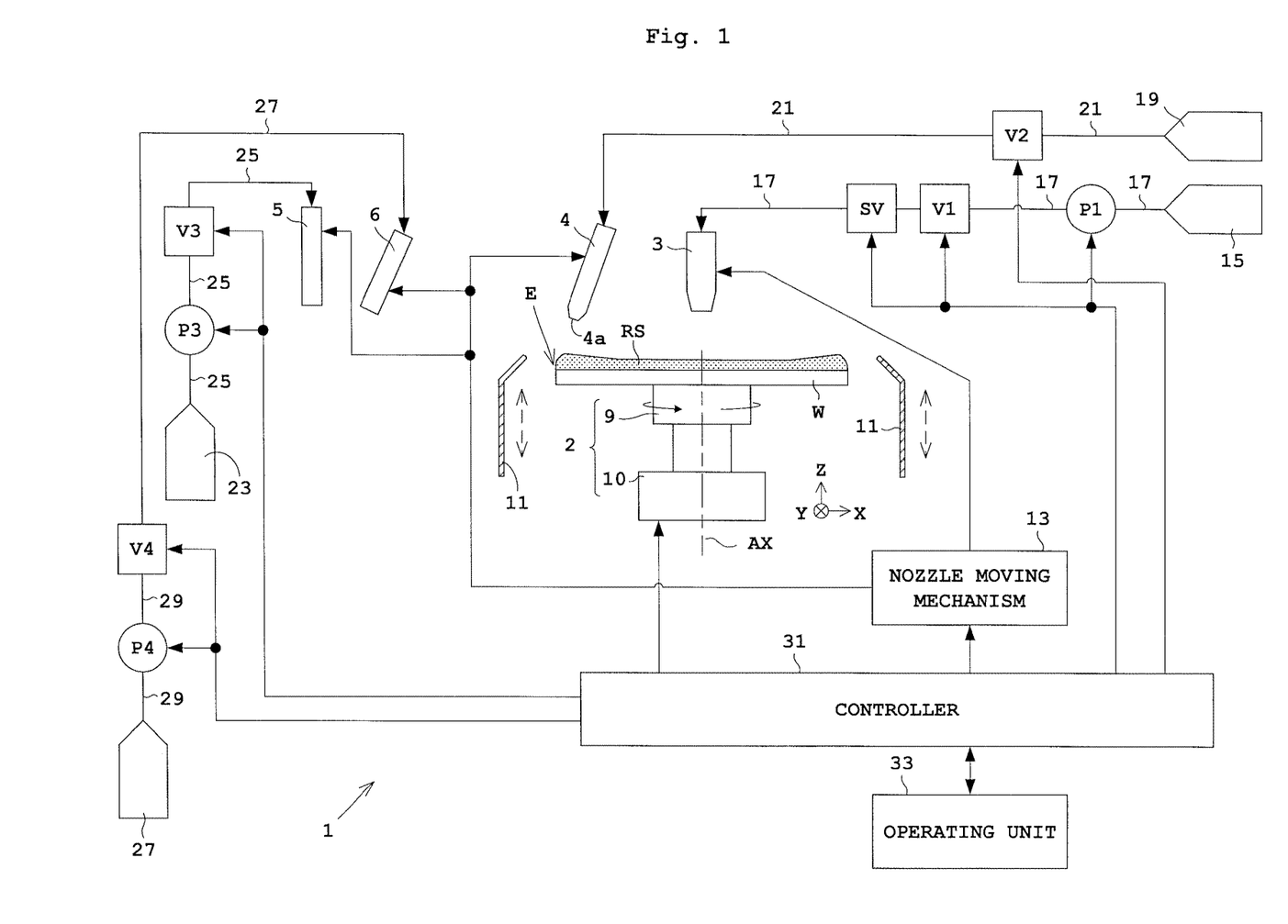
FIG. 1 is a block diagram of a coating apparatus according to one embodiment.

The following describes embodiments of the present invention with reference to drawings. FIG. 1 is a block diagram of a coating apparatus according to one Embodiment.

<Configuration of Coating Apparatus>

Reference is made to FIG. 1. The coating apparatus 1 includes a holding rotator 2 that holds and rotates a substrate W in a substantially horizontal attitude, a coating nozzle 3 that dispenses a coating liquid RS such as a resist to the substrate W, and a gas nozzle 4 that blows gas GS to the substrate W. The coating apparatus 1 further includes a pre-wet nozzle 5 that dispenses a pre-wet liquid PW such as solvent to the substrate W, and an edge rinse nozzle 6 that dispenses an edge rinse liquid such as solvent to a periphery edge E of the substrate W.

It should be noted that FIG. 1 illustrates the holding rotator 2, the coating nozzle 3, the gas nozzle 4, the pre-wet nozzle 5, the edge rinse nozzle 6, and the like in side view.

The holding rotator 2 includes a spin chuck 9 that holds a rear face of the substrate W through vacuum-suction, and a rotation drive unit 10 that is composed of a motor and the like for rotating the spin chuck 9 around a rotation axis AX in a substantially vertical direction. A cup 11 that is movable upwardly/downwardly is disposed around the holding rotator 2 so as to surround a lateral side of the substrate W.

The coating nozzle 3, the gas nozzle 4, the pre-wet nozzle 5, and the edge rinse nozzle 6 are each moved by a nozzle moving mechanism 13 horizontally and vertically to a preset position. The nozzle moving mechanism 13 grasps one of the coating nozzles 3 selectively to move the grasped coating nozzle 3 between a stand-by position outside the substrate W and a preset position above the substrate W. The nozzle moving mechanism 13 is composed of a motor and the like.

The coating liquid RS is supplied from a coating liquid supplying source 15 to the coating nozzle 3 through a coating liquid pipe 17. A suck back valve SV, an on-off valve V1, and a pump P1 are interposingly arranged on the coating liquid pipe 17. The on-off valve V1 performs supply and stops the supply of the coating liquid RS. The suck back valve SV sucks the coating liquid RS within the coating nozzle 3 and pushes out the sucked coating liquid RS in cooperation with the on-off valve V1. The pump P1 feeds the coating liquid RS to the coating nozzle 3. When a plurality of coating nozzles 3 are provided, the coating nozzles 3 each include a supply system such as the coating liquid supplying source 15, the coating liquid pipe 17, the suck back valve SV, the on-off valve V1, and the pump P1.

A gas supplying source 19 supplies gas GS through a gas pipe 21 to the gas nozzle 4. An on-off valve V2 is interposingly arranged on the gas pipe 21. The on-off valve V2 performs supply and stops the supply of the gas GS. The gas GS blown by the gas nozzle 4 to be used is selected from an inactive gas such as nitrogen, air, and other types of gas. Moreover, the gas GS may be one containing vapors of the solvent (vapored solvent) of the coating liquid RS. A temperature control mechanism, not shown, may control temperatures of the gas.

A blowing port 4a of the gas nozzle 4 is not an elongate opening like a slit, but is in a substantially circular shape as in FIG. 5(d) mentioned later. Such a substantially circular shape includes an ellipse shape and a polygon such as a regular polygon. Since the gas GS is able to be blown as dots, an excess of the coating liquid RS is readily exhausted out of the substrate W. Moreover, it is preferred that an internal diameter of the pipe of the gas nozzle 4, i.e., an internal diameter of the blowing port 4a for the gas GS is below 5 mm. Accordingly, the gas GS is blown to the periphery edge E of the substrate W in a pinpoint manner, leading to ready exhaust of the excess of the coating liquid RS out of the substrate W.

A pre-wet liquid supplying source 23 supplies a pre-wet liquid PW to the pre-wet nozzle 5 through a pre-wet liquid pipe 25. An on-off valve V3 and a pump P3 are interposingly arranged on the pre-wet liquid pipe 25. The on-off valve V3 performs supply and stops the supply of the pre-wet liquid PW. The pump P3 feeds the pre-wet liquid PW to the pre-wet nozzle 5.

An edge rinse liquid supplying source 27 supplies an edge rinse liquid to the edge rinse nozzle 6 through an edge rinse liquid pipe 29. An on-off valve V4 and a pump P4 are interposingly arranged on the edge rinse liquid pipe 29. The on-off valve V4 performs supply and stops the supply of the edge rinse liquid. The pump P4 feeds the edge rinse liquid to the edge rinse nozzle 6.

The coating apparatus 1 includes a controller 31 composed of a central processing unit (CPU) and the like, and an operating unit 33 for operating the coating apparatus 1. The controller 31 controls each element of the coating apparatus 1. The operating unit 33 includes a display unit such as a liquid crystal monitor, a memory unit such as a ROM (Read-only Memory), a RAM (Random-Access Memory), and a hard disk, and an input unit such as a keyboard, a mouse, and various types of buttons. The memory unit stores various conditions for coating.

<Coating by Coating Apparatus>

Figure 2:
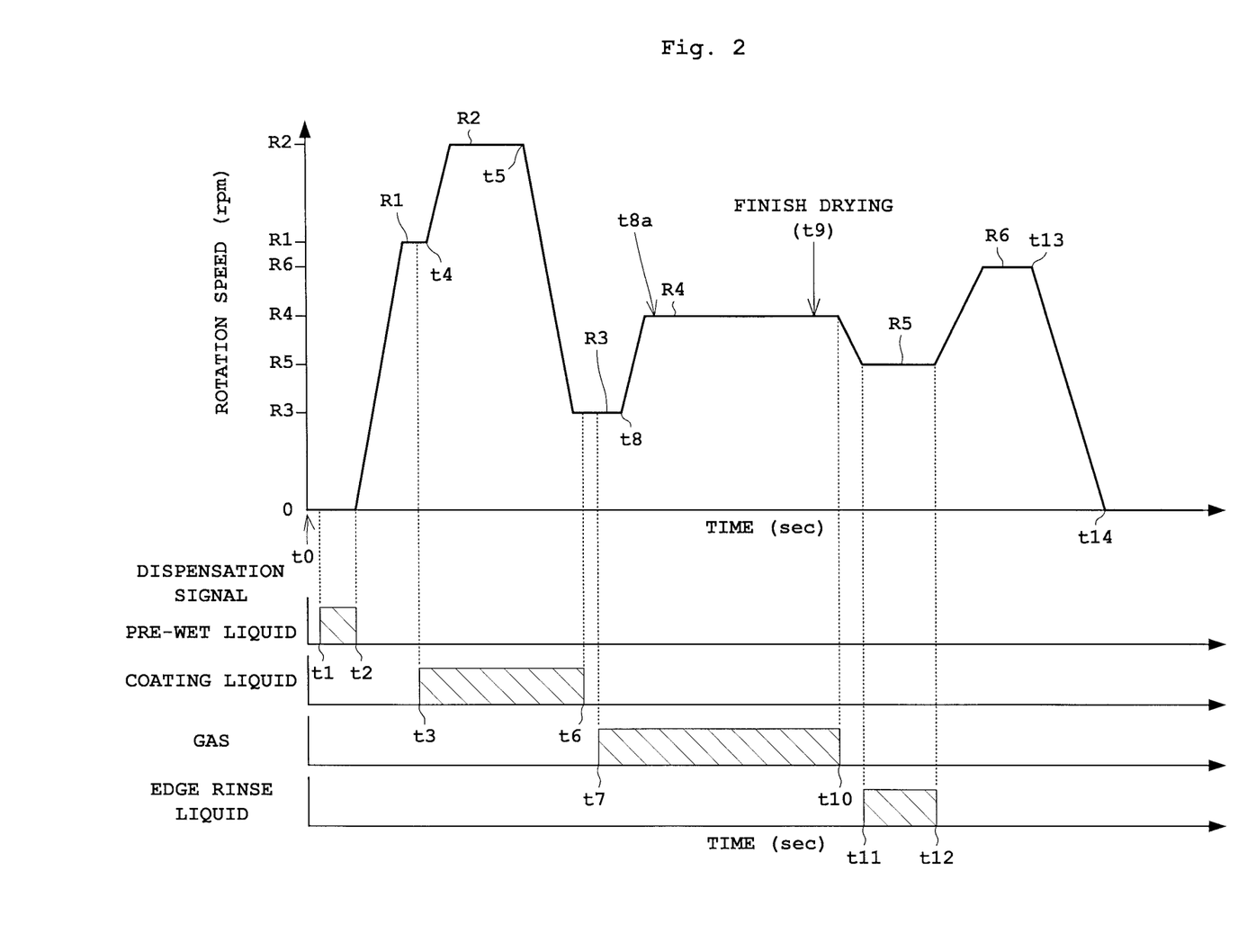
FIG. 2 illustrates a coating timing.

The following describes coating by the coating apparatus 1 with reference to FIG. 2 and the like. FIG. 2 illustrates a coating timing. Note that the substrate W may have a diameter of other than 300 mm although the substrate W whose diameter is 300 mm is described hereinunder.

Firstly, the characteristic feature of the present embodiment is to be described. As mentioned above, it is desired to obtain a thick film of the coating liquid RS by adjusting the rotation speed while the viscosity is not increased and thus is kept low. However, if the substrate W is rotated at a low speed during main spin for adjusting the thickness of the coating liquid film RS, the coating liquid RS remains at the periphery edge E of the substrate W where the coating liquid film RS is thicker than that at the center of the substrate W. Accordingly, the gas nozzle 4 blows the gas GS to the periphery edge E of the substrate W during the main spin before a drying process when the coating liquid RS on the substrate W never flows by rotation. This allows break of a balanced coating liquid RS remaining and building up without draining out of the substrate W due to the surface tension. As a result, the thick film is formed to be uniform from the center toward the periphery edge E of the substrate W upon the formation at the low rotation speed.

The coating is performed during a period of time t0 to time t14 in FIG. 2. The coating includes the pre-wet process, the coating liquid dispensing process, a thickness adjusting process to the coating liquid film RS (main spin), the gas blowing process, and the edge rinse process. Firstly, a transport mechanism, not shown, transports the substrate W to the holding rotator 2. The holding rotator 2 holds the rear face of the substrate W as in FIG. 1. The nozzle moving mechanism 13 moves the pre-wet nozzle 5 to a preset position above the substrate W.

<Pre-Wet Process>

Figure 3:
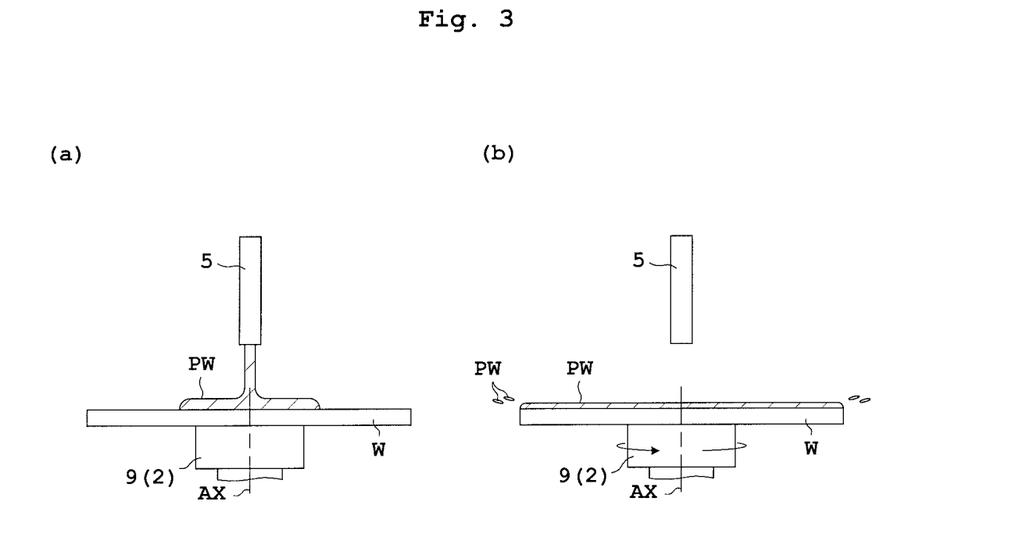
FIGS. 3(a) and 3(b) are each a side view for illustrating a pre-wet process.

The coating apparatus 1 dispenses the pre-wet liquid PW through the pre-wet nozzle 5 as in FIG. 3(a) during a period of time t1 to time t2 in FIG. 2. Here, the pre-wet liquid PW may be dispensed while the substrate W is rotated.

The holding rotator 2 rotates the held substrate W at a preset rotation speed R1 (rpm) at time t2 in FIG. 2. This rotation causes the pre-wet liquid PW dispensed on the substrate W to spread radially to form a pre-wet liquid film PW as in FIG. 3(b). After the pre-wet liquid PW is dispensed, the nozzle moving mechanism 13 moves the coating nozzle 3, instead of the pre-wet nozzle 5, to a preset position above the substrate W.

<Coating Liquid Dispensing Process>

Figure 4:
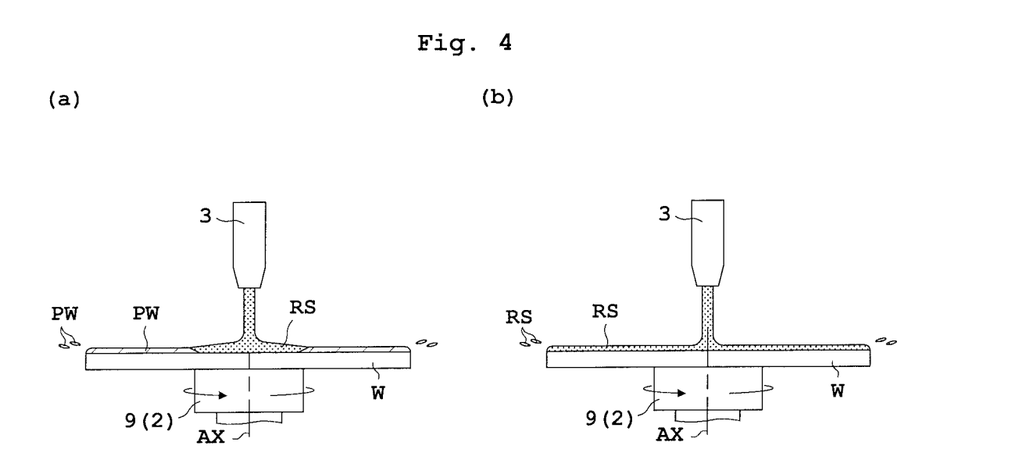
FIGS. 4(a) and 4(b) are each a side view for illustrating a coating liquid dispensing process.

The coating apparatus 1 dispenses the coating liquid RS to the substrate W through the coating nozzle 3 as in FIG. 4(a) at time t3 in FIG. 2 (start of dispensation). The holding rotator 2 increases the rotation speed at time t4 in FIG. 2 to rotate the substrate W at a preset rotation speed R2. The rotation at the rotation speeds R1 and R2 causes the coating liquid RS dispensed on the substrate W to spread radially as in FIG. 4(b). Here, the coating liquid RS partially scatters outside the substrate W. In addition, since the pre-wet liquid film PW is formed on the substrate W as mentioned above, the coating liquid RS rapidly spreads. The holding rotator 2 decreases the rotation speed at time t5 in FIG. 2 to rotate the substrate W at a preset rotation speed R3. The coating nozzle 3 finishes (stops) dispensation of the coating liquid RS at time t6.

<Coating Liquid Film Thickness Adjusting process and Gas Blowing Process>

Figure 5:
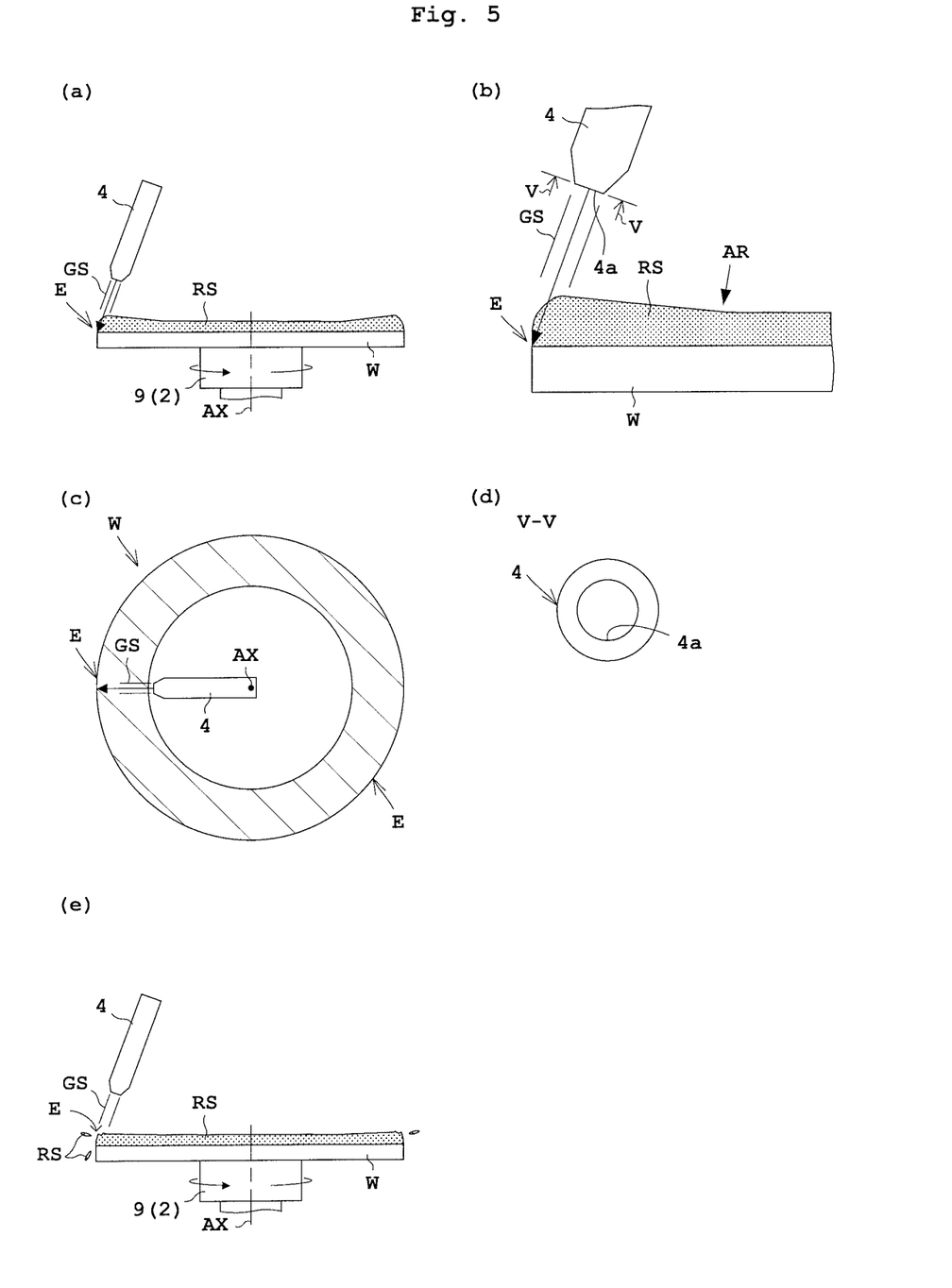
FIG. 5(a) is a side view for illustrating gas blowing.
FIG. 5(b) is a partially enlarged view of FIG. 5(a)
FIG. 5(c) is a plan view of FIG. 5(a)
FIG. 5(d) illustrates a blowing port of a gas nozzle seen in a V-V direction of FIG. 5(b)
FIG. 5(e) illustrates a condition in which a coating liquid film remaining on a periphery edge of a substrate becomes planarized due to the gas blowing.

After coating with the coating liquid RS, the coating apparatus 1 blows the gas GS to the periphery edge E of the substrate W through the gas nozzle 4 as in FIG. 5(a) at time t7. Prior to the description of blowing the gas GS, rotation of the substrate W for adjustment in thickness of the coating liquid film RS is to be described.

The holding rotator 2 increases the rotation speed at time t8 to rotate the substrate W to a preset rotation speed R4 for adjustment in thickness of the coating liquid film RS dispensed on the substrate W. As mentioned above, a step performed from when the dispensation of the coating liquid RS is finished until when the drying of the coating liquid RS is finished is called main spin. In other words, the main spin is substantially a period during which the substrate W is rotated at the rotation speed R4. The thickness of the coating liquid film RS corresponding to the rotation speed R4 is obtainable in response to the magnitude of the rotation speed R4.

Conventionally, the substrate W is rotated, whereby the coating liquid film RS is formed on the substrate W without building up along the periphery edge E of the rotating substrate W. In contrast to this, in the present embodiment, it is desired to form the coating liquid film RS to be thick by adjusting the rotation speed of the substrate W. Firstly, in the present embodiment, the holding rotator 2 rotates the substrate W to form the coating liquid film RS on the substrate W, and pushes at least a part of the excess of the coating liquid RS to the periphery edge E of the substrate W due to the centrifugal force caused by the rotation of the substrate W such that the excess of the coating liquid RS builds up at the periphery edge E of the substrate W. At this time, the substrate W is rotated at the rotation speed R4. Note that build-up of the excess of the coating liquid RS mentioned above is performed under no consideration of blowing of the gas GS.

When the coating liquid RS is dried while the excess of the coating liquid RS builds up at the periphery edge E of the substrate W, the coating liquid film RS whose thickness has poor uniformity is to be obtained. Accordingly, the coating apparatus 1 blows the gas GS to the periphery edge E of the substrate W through the gas nozzle 4 as in FIG. 5(a).

FIG. 5(b) illustrates an enlarged gas blowing portion of FIG. 5(a). In the present embodiment, the gas nozzle 4 disposed above the substrate W blows the gas GS to the periphery edge E of the substrate W from an inside portion to an outside portion of the substrate W as in FIG. 5(c). The gas GS need to be blown before the coating liquid film RS on the substrate W is completely dried by rotation at the rotation speed R4, i.e., while the coating liquid RS flows. The gas GS is blown as dots in FIG. 5(d). Here, the nozzle moving mechanism 13 moves the gas nozzle 4 to a preset blowing position before the gas GS is blown.

The coating liquid RS not exhausted out of the substrate W and therefore remaining and building up at the periphery edge E of the substrate W is primarily caused by the surface tension. Blowing the gas GS allows breaking of a balanced coating liquid RS that is not exhausted out of the substrate and thus remains and builds up due to the surface tension. Accordingly, the excess of the coating liquid RS building up at the periphery edge E is exhausted out of the substrate W as in FIG. 5(e), leading to a uniform thickness of the coating liquid film RS while the coating liquid film RS is formed to be thick.

For instance, the rotation speed R4 of the substrate W for building up the excess of the coating liquid RS is preferably more than 0 rpm and below (or less than) 500 rpm. When the substrate W is rotated at the rotation speed R4 below 500 rpm, the coating liquid film RS becomes thick sharply and outwardly from a portion spaced away by 120 mm from the center of the substrate W. This is to be described in detail.

The spin coating is performed by pushing the undried coating liquid RS with flowability from the center to the periphery edge E of the substrate W through the centrifugal force caused by the rotation of the substrate W. With the rotation at the high speed of more than 500 rpm (preferably, 800 rpm), the excess of the coating liquid RS is exhausted from the periphery edge E of the substrate W. However, with the rotation at the low speed below 500 rpm, the excess of the coating liquid RS remains at the periphery edge E of the substrate W due to a surface tension made by the coating liquid and the substrate W. Accordingly, the drying process starts while the coating liquid RS remains at the periphery edge E of the substrate W. This causes a portion where the coating liquid RS remains at the periphery edge E is dried to become thick like a mountain. Note that the portion where the coating liquid film RS builds up is denoted by oblique line hatching in FIG. 5(c).

Figure 6:
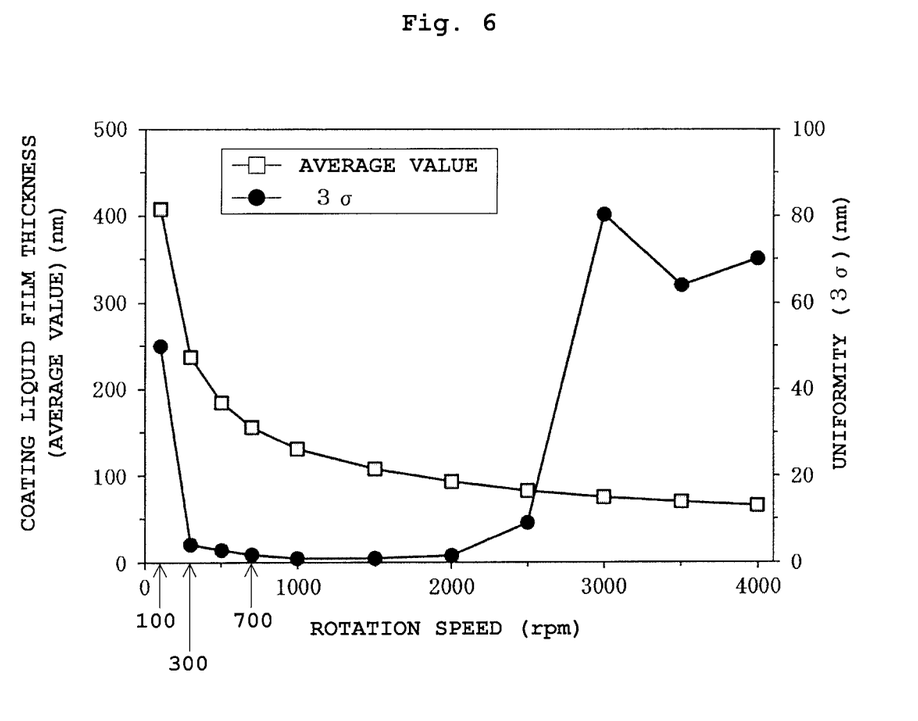
FIG. 6 illustrates a thickness of the coating liquid film and its uniformity relative to a rotation speed.

FIG. 6 illustrates a thickness (average value) of the coating liquid film RS and uniformity of the coating liquid film RS (3σ) of a 300 mm wafer at the rotation speed R4. It is revealed that the thickness and the uniformity (3σ) of the coating liquid film RS increase at the rotation speed R4 below 500 rpm.

Accordingly, in order to avoid an increased and non-uniform thickness of the coating liquid film RS at the periphery edge E, the coating apparatus 1 blows the gas GS to the periphery edge E of the substrate W through the gas nozzle 4 before the coating liquid RS on the substrate W is dried by the rotation, thereby helping exhaust of not all but a part of the coating liquid RS remaining at the periphery edge E out of the substrate W. That is, the gas GS is blown for exhausting the excess of the coating liquid RS remaining at the periphery edge E out of the substrate W while the coating liquid film RS is undried and remains flowability. This achieves a relationship "a surface tension is smaller than a centrifugal force and pressure by the gas", leading to exhaust of the excess of the coating liquid RS remaining at the periphery edge E out of the substrate W. Therefore, a non-uniform film thickness is avoidable caused by building up the coating liquid RS remaining at the periphery edge E of the substrate W, and thus a uniform thick film is obtainable from the center to the periphery edge E of the substrate W by the rotation at the low speed.

Figure 7:
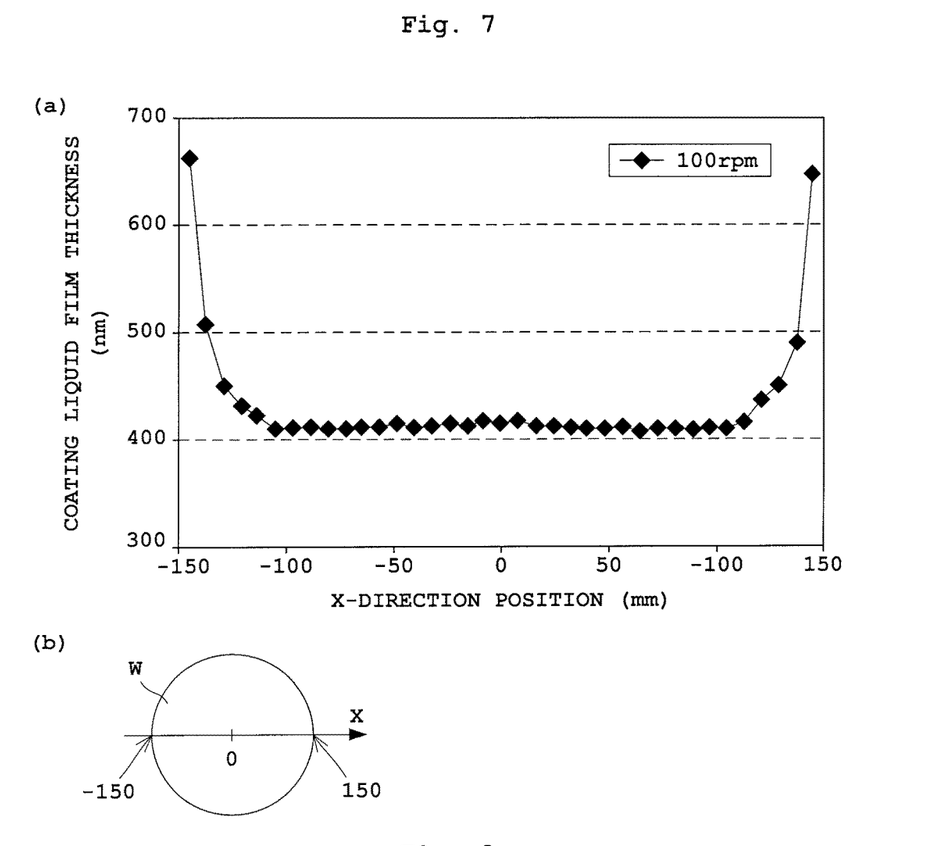
FIG. 7(a) illustrates a thickness of the coating liquid film within the substrate when no gas blowing is performed.
FIG. 7(b) illustrates a determination position within the substrate of FIG. 7(a).
Figure 8:
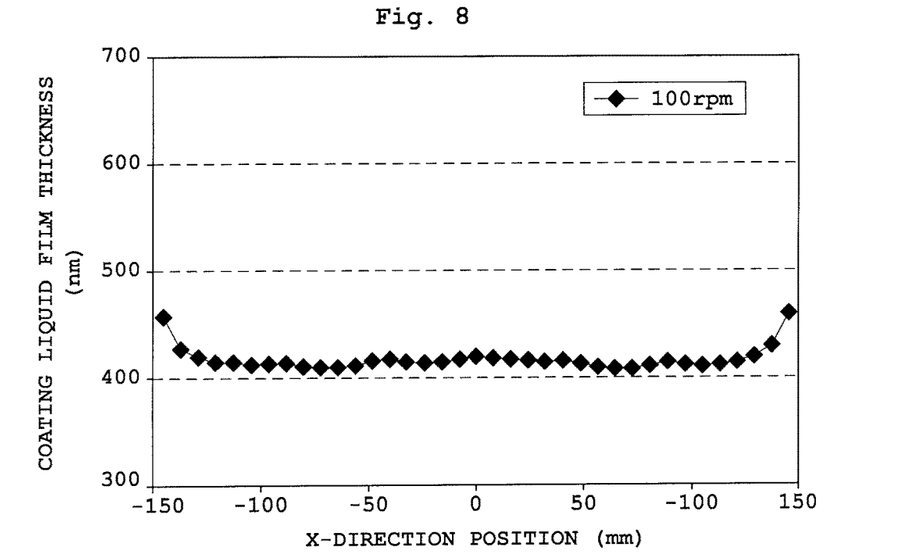
FIG. 8 illustrates a thickness of the coating liquid film within the substrate when the gas blowing is performed.

The following describes an effect of the gas blowing with reference to FIGS. 7 (a), 7(b), and 8. FIG. 7(a) illustrates a thickness of the coating liquid film RS within the substrate when no gas blowing is performed. In contrast to this, FIG. 8 illustrates a thickness of the coating liquid film RS within the substrate when the gas blowing is performed. Both in FIGS. 7(a) and 8, the rotation speed R4 for adjusting the thickness of the coating liquid film RS is 100 rpm. In FIG. 7(a), the thickness of the coating liquid film RS sharply increases at a position spaced away from the center of the substrate W (corresponding to a position "0" in an X-direction). On the other hand, the sharp increase of the thickness is suppressed in FIG. 8. Consequently, it is revealed that the thick film is able to be formed to have a uniform thickness by the rotation at the low speed. It should be noted that the substrate W is determined at a position in FIG. 8 same as that in FIG. 7(a), and is illustrated in FIG. 7(b).

At time t9 in FIG. 2, the coating liquid RS on the substrate W is not brought into flow by the rotation at the rotation speed R4. This completes the drying of the coating liquid RS. At time t10, the holding rotator 2 decreases the rotation speed to rotate the substrate W at a preset rotation speed R5. Note that the blowing of the gas GS is finished (stopped) at the time t10. Alternatively, the blowing of the gas GS may be finished (stopped) upon the drying is finished (at the time t9), or may be finished until time t11 when the edge rinse liquid is dispensed, which is to be mentioned later.

<Edge Rinse Process>

Figure 9:
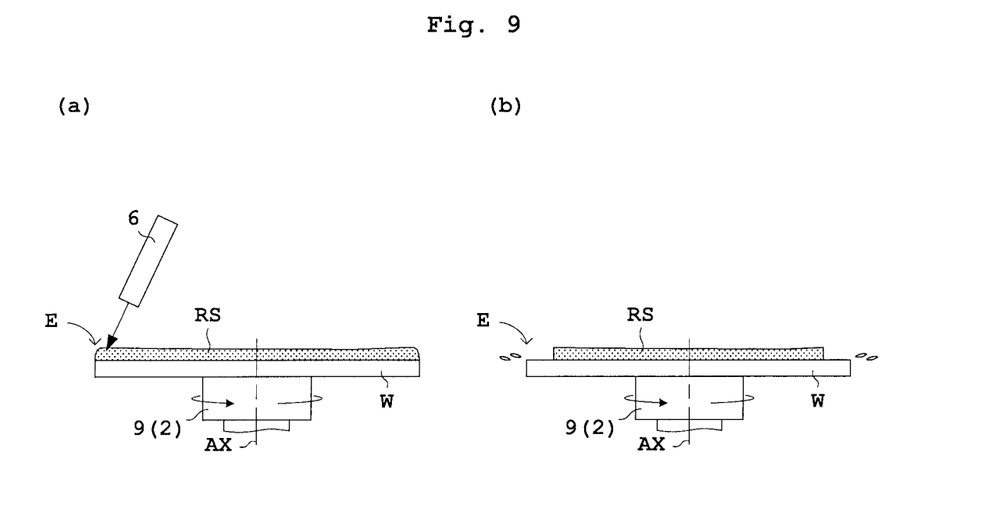
FIGS. 9(a) and 9(b) each illustrate an edge rinse process.

The nozzle moving mechanism 13 moves the edge rinse nozzle 6 to a dispensing position. The coating apparatus 1 performs the edge rinse process to the coating liquid film RS at the periphery edge E of the substrate W after the drying of the coating liquid film RS on the substrate W is finished by the rotation at the rotation speed R4. That is, the coating apparatus 1 dispenses the edge rinse liquid through the edge rinse nozzle 6 as in FIG. 9(a), and removes the coating liquid film RS at the periphery edge E of the substrate W by a given width as in FIG. 9(b) during a period of time t11 to time t12 in FIG. 2. Then, the holding rotator 2 increases the rotation speed at time t12 in FIG. 2 to rotate the substrate W at a preset rotation speed R6. This causes the edge rinse liquid dispensed on the substrate W through the edge rinse nozzle 6 to be subjected to the spin drying. At time t13, the holding rotator 2 stops rotation of the substrate W. At time t14, the substrate W stops.

As mentioned above, the coating is completed. Thereafter, the holding rotator 2 releases its holding of the substrate W. The substrate W on the holding rotator 2 is transported to a subsequent processing unit by a substrate transport mechanism not shown.

With the present embodiment, the holding rotator 2 rotates the substrate W at the rotation speed below 500 rpm, for example, to form the liquid film of the coating liquid RS on the substrate W, and at least a part of the excess of the coating liquid RS is pushed toward the periphery edge of the substrate by a centrifugal force caused by the rotation of the substrate W so as to build up along the periphery edge E of the substrate W. Moreover, the gas GS is blown to the periphery edge E of the substrate W through the gas nozzle 4 to exhaust the excess of the coating liquid RS building up at the periphery edge E. Blowing the gas GS toward the periphery edge E of the substrate W through the gas nozzle 4 makes the coating liquid RS unbalanced that builds up without being exhausted outside the substrate W due to its surface tension. Accordingly, the rotation achieves the liquid film of the coating liquid RS having a uniform thickness while the liquid film of the coating liquid RS is formed to be thick.

Moreover, the gas GS is blown to the periphery edge E of the substrate W through the gas nozzle 4 before the drying of the coating liquid RS on the substrate W by the rotation is finished and after the coating liquid RS is dispensed. If the gas GS is blown while the coating liquid RS is dispensed to the substrate W, control should be made to both the dispensation of the coating liquid RS and the blowing of the gas GS. However, since the gas GS is blown after the dispensation of the coating liquid RS is finished, control may be made to either the dispensation of the coating liquid RS or the blowing of the gas GS, leading to simplified control.

Moreover, the coating apparatus 1 blows the gas GS through the gas nozzle 4 at the periphery edge E of the substrate W from an inside portion to an outside portion of the substrate W in the gas blowing process. This allows effective exhaust of the coating liquid RS remaining at the periphery edge E of the substrate W outside the substrate W.

Moreover, the coating apparatus 1 performs the edge rinse process to the coating liquid film RS at the periphery edge E of the substrate W after the coating liquid film RS on the substrate is dried by the rotation. The coating liquid film RS at the periphery edge E of the substrate W that readily becomes thicker is removed with the edge rinse, whereby a more planar coating liquid film RS is formable. In addition, the gas GS is blown to exhaust the excess of the coating liquid RS building up at the periphery edge E of the substrate W, whereby a uniform thick film is obtainable. This causes a suppressed width of the substrate to which the edge rinse is performed, achieving pattern formation near the periphery edge E of the substrate W.

The present invention is not limited to the foregoing examples, but may be modified as follows.

(1) In the embodiment mentioned above, the position of the gas nozzle 4 is fixed upon the gas blowing process. This achieves simplified control of the gas nozzle 4. Alternatively, the gas nozzle 4 may be movable by a preset width WD of the periphery edge E of the substrate W in a radius direction RD of the substrate W as in FIG. 10 upon the gas blowing process. That is, the gas nozzle 4 scans (reciprocates or moves one way) while blowing the gas.

Figure 10:
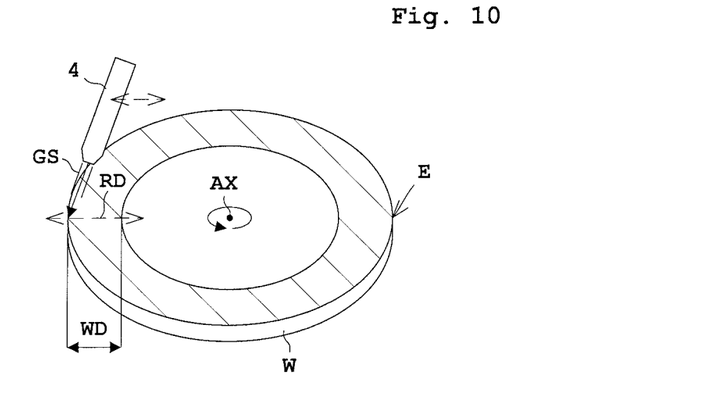
FIG. 10 is a perspective view for illustrating gas blowing according to one modification.

This allows variation in blowing position of the gas GS toward the periphery edge E of the substrate W, and thus leads to promoted exhaust of the coating liquid RS remaining at the periphery edge E of the substrate W. As illustrated in FIG. 10, the width WD may be a length between the inside and the outside of a remained ring portion of the coating liquid RS (illustrated by oblique line hatching) that remains at the periphery edge E. Alternatively, the width WD may be smaller than the length. Moreover, not only one-time movement but also plural-time movement of the gas nozzle 4 is performable.

(2) In the embodiment and the modification (1) mentioned above, the gas nozzle 4 may blow the gas GS for a preset period of time in the gas blowing process. This allows the excess of the coating liquid RS remaining at the periphery edge E of the substrate W to be exhausted out of the substrate W in response to the period of time during which the gas GS is blown. Examples of the pre-set period of time include a period of time t7 to t10 in FIG. 2.

(3) In the embodiment and the modifications mentioned above, the gas nozzle 4 may blow the gas GS at preset pressure in the gas blowing process. This allows the excess of the coating liquid RS remaining at the periphery edge E of the substrate W to be exhausted out of the substrate Win response to the pressure of the gas GS blown. For instance, the pressure is not necessarily pressure at which the coating liquid RS in a blowing position on the substrate W is completely blown out, but may pressure at which the coating liquid RS remaining and building up at the periphery edge E due to the surface tension becomes unbalanced.

(4) In the embodiment and the modifications mentioned above, the gas nozzle 4 blows the gas GS to the periphery edge E one time as in FIG. 2. Alternatively, the gas nozzle 4 may blow the gas GS plural times set in advance in the gas blowing process. For instance, the frequency of blowing the gas is controlled for the preset period of time, leading to control of a quantity of the excess of the coating liquid RS exhausted outside the substrate W. In addition, blowing the gas GS intermittently allows variation in blowing the gas GS.

(5) In the embodiment and the modifications mentioned above, the gas nozzle 4 blows the gas GS to the periphery edge E as in FIG. 5(b). Alternatively, the gas GS may be blown near the periphery edge E. For instance, as illustrated by the arrow AR in FIG. 5(b), the gas GS may be blown to an inside portion (the foot of the mountain) of the coating liquid RS remaining at the periphery edge E.

(6) In the embodiment and the modifications mentioned above, the gas nozzle 4 disposed above the substrate W blows the gas GS. Alternatively, the gas nozzle 4 disposed in a position other than the above position, e.g., below the substrate W, may blow the gas if the unbalanced surface tension of the coating liquid RS remaining at the periphery edge E is obtainable.

(7) In the embodiment and the modifications mentioned above, the gas nozzle 4 blows the gas GS from the inside to the outside of the substrate W. Alternatively, the gas GS may be blown in a direction other than that from the inside to the outside of the substrate W, e.g., in a vertical direction, if the unbalanced surface tension to the coating liquid RS remaining at the periphery edge E is obtainable.

(8) In the embodiment and the modifications mentioned above, the gas blowing process starts at the time t7 in FIG. 2. This allows the coating liquid RS pushed to the periphery edge E to be exhausted out of the substrate W. Alternatively, the gas blowing process may be made in a constant state as in the time t8a in FIG. 2 after the rotation at the rotation speed R4 for building up the excess of the coating liquid RS. Specifically, the gas nozzle 4 blows the gas GS to the periphery edge E of the substrate W in the gas blowing process before the drying of the coating liquid RS on the substrate W by the rotation of the substrate W is finished and after the substrate W is rotated at the rotation speed R4 for building up the excess of the coating liquid RS. The gas GS is blown in a constant stable condition after the substrate W is rotated at the rotation speed R4 for building up the excess of the coating liquid RS, leading to simplified control of the gas blowing.

(9) In the embodiment and the modifications mentioned above, the blowing of the gas GS starts at the time t7 in FIG. 2. Alternatively, the blowing of the gas GS may start upon starting dispensation of the coating liquid RS (time t3) or upon finishing dispensation of the coating liquid RS (time t6). Alternatively, the time t8 when the rotation speed R3 increases to the rotation speed R4 is adoptable. Alternatively, time is adoptable when the coating liquid RS partially or entirely reaches the periphery edge E by the rotation after the time t3. That is, the blowing starts while the undried coating liquid RS flows.

(10) In the embodiment and the modifications mentioned above, one example of the coating is described in FIG. 2. However, the coating in FIG. 2 is not limitative. For instance, a magnitude relationship among the rotation speeds R2 to R4 may be replaceable or equal to one another.

REFERENCE SIGNS LIST

1 . . . coating apparatus
2 . . . holding rotator
3 . . . coating nozzle
4 . . . gas nozzle
4a . . . blowing port
6 . . . edge rinse nozzle
E . . . periphery edge
PW . . . pre-wet liquid (pre-wet liquid film)
RS . . . coating liquid (coating liquid film)

The invention claimed is:

1. A coating method, comprising:
a dispensing step of dispensing a coating liquid to a substrate through a coating nozzle;
a coating liquid spreading step of spreading the coating liquid on the substrate by rotating the substrate with a holding rotator;
a coating liquid building-up step of pushing at least a part of an excess of the coating liquid toward a periphery edge of the substrate with a centrifugal force caused by rotation of the substrate to build up the excess of the coating liquid along the periphery edge of the substrate after the coating liquid spreading step of spreading the coating liquid; and
a gas blowing step of blowing gas through a gas nozzle to the periphery edge of the substrate before drying of the coating liquid on the substrate by the rotation of the substrate is finished to exhaust the excess of the coating liquid building up at the periphery edge outside the substrate while a coating liquid film having a given film thickness remains at the peripheral edge, wherein
the rotation speed of the substrate in the coating liquid building-up step is lower than the rotation speed of the substrate in the coating liquid spreading step.

2. The coating method according to claim 1, wherein
in the coating liquid building-up step, the substrate is rotated for building up the excess of the coating liquid at a rotation speed below 500 rpm.

3. The coating method according to claim 1, wherein
in the gas blowing step, the gas is blown to the periphery edge of the substrate through the gas nozzle before the drying of the coating liquid on the substrate by the rotation is finished and after dispensation of the coating liquid is finished.

4. The coating method according to claim 1, wherein
in the gas blowing step, the gas is blown to the periphery edge of the substrate through the gas nozzle before the drying of the coating liquid on the substrate by the rotation is finished and after the substrate is rotated to a rotation speed at which the excess of the coating liquid builds up.

5. The coating method according to claim 1, wherein in the gas blowing step, the gas is blown through the gas nozzle for a preset period of time.

6. The coating method according to claim 1, wherein in the gas blowing step, the gas is blown through the gas nozzle at preset pressure.

7. The coating method according to claim 1, wherein in the gas blowing step, the gas is blown through the gas nozzle a plurality of times set in advance.

8. The coating method according to claim 1, wherein in the coating method, the gas nozzle has a circular blowing port.

9. The coating method according to claim 1, wherein in the gas blowing step, the gas is blown through the gas nozzle to the periphery edge of the substrate from an inside portion to an outside portion of the substrate.

10. The coating method according to claim 1, further comprising:
an edge rinse step of performing edge rinse to the coating liquid at the periphery edge of the substrate after the drying of the coating liquid film on the substrate by the rotation is finished.

11. The coating method according to claim 1, wherein in the gas blowing step, the gas nozzle is fixedly disposed.

12. The coating method according to claim 1, wherein in the gas blowing step, the gas nozzle is movable in a radius direction of the substrate by a preset width of the periphery edge of the substrate.

* * * * *